(12) United States Patent
Lundy et al.

(10) Patent No.: US 6,329,123 B1
(45) Date of Patent: Dec. 11, 2001

(54) PHOTOIMAGEABLE COMPOSITIONS HAVING IMPROVED FLEXIBILITY AND STRIPPING ABILITY

(75) Inventors: Daniel E. Lundy, Pomona; Robert K. Barr; Edward J. Reardon, both of Laguna Niguel, all of CA (US)

(73) Assignee: Morton International Inc., Chicago, IL (US)

( * ) Notice: Subject to any disclaimer, the term of this patent is extended or adjusted under 35 U.S.C. 154(b) by 0 days.

(21) Appl. No.: 09/364,495

(22) Filed: Jul. 30, 1999

Related U.S. Application Data

(63) Continuation-in-part of application No. 09/209,353, filed on Dec. 11, 1998.

(51) Int. Cl.[7] .............................. G03F 7/033; G03F 7/038
(52) U.S. Cl. ............................ 430/284.1; 522/95; 522/97
(58) Field of Search .......................... 430/284.1; 522/95, 522/97; 528/75, 74.5, 60, 65, 66, 73, 72

(56) References Cited

U.S. PATENT DOCUMENTS

| | | | |
|---|---|---|---|
| 4,691,045 | * 9/1987 | Fukuchi et al. | 560/185 |
| 4,843,111 | * 6/1989 | Yokoshima et al. | 522/95 |
| 5,115,025 | * 5/1992 | Koleskeetal | 525/162 |
| 5,166,186 | * 11/1992 | Kojima et al. | 522/37 |
| 5,616,630 | * 4/1997 | Heinz et al. | 522/97 |
| 5,990,192 | * 11/1999 | Gerlitz et al. | 522/97 |

OTHER PUBLICATIONS

"Lactone", from Harcourt, http://www.hardcourt.com, taken from *Academic Press Dictionary of Science and Technology*, on Jun. 4, 2000.*

* cited by examiner

*Primary Examiner*—Cynthia Hamilton

(57) ABSTRACT

A negative-acting photoimageable composition useful as a primary imaging resist in the manufacture of printed circuit boards comprises an acid-functional binder polymer, a photopolymerizable component, and a photoinitiator chemical system, in which all or a portion of the photopolymerizable component comprises a (meth)acrylate functional urethane oligomer, wherein the (meth)acrylate functionality is separated from the urethane linkage by at least two alkylene oxide groups and at least one ring-opened lactone group for improved flexibility, tenting strength, fine line adhesion, developer scumming, coupled with unexpectedly improved resistance to processing chemicals, such as alkaline developing solutions, acid etching solutions, and acid plating baths, and stripping ability in strong alkaline aqueous stripping solutions.

8 Claims, No Drawings

PHOTOIMAGEABLE COMPOSITIONS HAVING IMPROVED FLEXIBILITY AND STRIPPING ABILITY

This application is a C-I-P of prior U.S. application Ser. No. 09/209,353, filed Dec. 11, 1998.

FIELD OF THE INVENTION

The present invention is directed to negative-acting photoimageable compositions such as those used as photoresists in the art of printed circuitry. The photoimageable composition contains, as a portion of its photoimageable component, a (meth)acrylate-functional urethane oligomer, wherein the (meth)acrylate functionality is separated from the urethane linkage by at least two alkylene oxide groups and at least one ring-opened lactone group.

BACKGROUND OF THE INVENTION

This invention is directed to negative-acting photoimageable compositions which are developable in alkaline aqueous solutions. The invention is particularly applicable to primary photoimaging resists, but is applicable, as well, to compositions that are hardenable so as to form solder masks and the like.

A variety of such photoimageable compositions are described throughout the patent literature. Essential components of the type of photoimageable compositions to which the present invention is directed include I) a binder polymer, II) photopolymerizable $\alpha,\beta$-ethylenically unsaturated compound(s), and III) a photoinitiator chemical system. The binder polymer I) has sufficient acid functionality, generally carboxylic acid functionality, that the binder polymer is soluble in dilute alkaline aqueous solution and thereby renders the photoimageable composition developable in such alkaline aqueous solutions. The photopolymerizable compound(s) II) are monomers and/or short chain oligomers, a substantial portion of which have multiple $\alpha,\beta$-ethylenic unsaturated functionality.

The photoinitiator chemical system Ill) includes chemicals which generate free radicals upon exposure to actinic radiation. These free radicals propagate the polymerization of the $\alpha,\beta$-ethylenic unsaturated moieties of the photopolymerizable compounds II). Herein, the photoinitiator system III) is deemed to include not only chemical compounds which generate free radicals, but catalysts or sensitizers which promote the free-radical initiated polymerization of the $\alpha,\beta$-ethylenic unsaturated moieties of the photopolymerizable compounds II).

Printed circuit boards almost invariably have through-holes to establish connections with circuitry on opposite faces of the board. Photoresists are required to "tent" these through-holes during processing. With holes becoming larger on circuit boards, higher tenting strength is becoming increasingly important; thus greater flexibility of photoimageable compositions after development is required. Improved flexibility also contributes to improved cross hatch adhesion which allows for better compatibility with automated polyester support film removal systems used to separate a support film from the photoresist after exposure and before development. If the photoresist is brittle, these support film removal systems will cause chipping of the exposed areas of photoresist predominantly at the edges of the panel and subsequently, circuit line defects.

By replacing a portion of conventional photoreactive monomers (like ethoxylated trimethylolpropane triacrylate) with an isocyanuric, urethane-based oligomer, a significant improvement to tenting strength and flexibility was observed. However, even though the flexibility was noticeably better, the fine line adhesion was not improved and the oligomer was shown to be a major source of developer scumming.

Improved flexibility, fine line adhesion and lower developer scumming has been demonstrated when the isocyanuric, urethane-based oligomer is comprised of the product of a polyethoxymono(meth)acrylate and the isocyanurate trimer of hexamethylene diisocyanate, as described, for example, in U.S. Pat. No. 5,744,282. The use of a (meth)acrylate-functional urethane product formed from a mono- or polyalkoxymono(meth)acrylolyl ester, such that the (meth)acrylate functionality is separated from the urethane linkage by one or more flexible alkylene oxide groups, in UV-curable photoresists enhances the performance of such compositions over those made with urethane compounds based on the isocyanurate trimer of hexamethylene diisocyanate. Alternatively, urethane oligomers have been proposed that are formed from monoalkoxymono- or di-caprolactone(meth)acrylolyl esters, which adds a mono- or di-caprolactone chain extension between the monoalkoxy (meth)acrylate functionality and the urethane linkage. Present day commercial applications require further improvements to flexibility, fine line adhesion and developer scumming, while not interfering with the chemical resistance of the photoresist to processing solutions and its stripping ability after formation of the patterned copper circuit lines.

Herein, novel (meth)acrylate-functional urethane oligomers based on polyalkoxy/polylactone (meth)acrylolyl esters are incorporated as at least a portion of the photopolymerizable component II). The (meth)acrylate-functional urethane oligomers of this invention are found to significantly improve flexibility and fine line adhesion of the photoresist and minimize developer scumming. Along with improving the aforesaid properties, it has been found that (meth)acrylate-functional urethane oligomers further enhance the chemical resistance of the exposed photoresist to processing solutions, such as developing, plating and etching solutions, and also its stripping ability in strong alkaline aqueous solutions.

SUMMARY OF THE INVENTION

The present invention is directed to a negative-acting photoimageable composition comprises I) between about 30 and about 80 wt %, based on total weight of I) plus II) plus III) of an organic polymeric binder having sufficient acid functionality to render the photoimageable composition developable in alkaline aqueous solution, II) between about 20 and about 70 wt % based on total weight of I) plus II) plus III) of addition-polymerizable, non-gaseous $\alpha,\beta$-ethylenically unsaturated compound(s) capable of forming a high polymer by free-radical initiated chain-propagating addition polymerization, and III) between about 0.1 and about 20 wt % based on the total weight of I) plus II) plus III) of an organic radiation-sensitive free-radical gene rating photoinitiator chemical system activatable by actinic radiation to initiate chain-propagating addition polymerization of the addition-polymerizable material.

In accordance with the invention, the improvement is wherein component II) of the photoimageable comprises between about 1 wt % and about 100 wt %, preferably at least about 20 wt % up to about 60 wt %, based on the total weight of II) of a novel (meth)acrylate-functional urethane oligomer represented by the formula:

$$T-I-(-P-I-)_q-T$$

where

I at each independent occurrence is selected from a polyfunctional aliphatic, cycloaliphatic, or aromatic isocyanate radical having an isocyanate functionality of 2 or greater, preferably an isocyanate radical of the formula:

$$-\!\!\left[\!\!\begin{array}{c}O\\\|\\C\end{array}\!\!-NH-R-NH-\begin{array}{c}O\\\|\\C\end{array}\!\!\right]\!\!-$$

or oligomeric, biuret, or isocyanurate thereof, where R is a polyvalent aliphatic, cycloaliphatic, or aromatic hydrocarbon group, with hexamethylene, cyclohexylene, and phenylene being generally preferred, T is bonded to each of the 2 or more isocyanate functionalities present in I not bonded to P and at each independent occurrence is selected from a (meth) acrylate-functional organic radical of the formula:

$$CH_2\!=\!\underset{R^1}{\overset{}{C}}H\!-\!\overset{O}{\overset{\|}{C}}\!-\!O\!-\!\![(A)_{\overline{x}}\!-\!(B)_{\overline{y}}\!-\!(E)_{\overline{z}}]_{\overline{m}}$$

where $R^1$ is a hydrogen atom or a methyl group,

A, B and E are in the order given or in any order, preferably in the order given A is an alkylene oxide group of the formula:
$-[-(CH_2)_n-O-]-$, or aromatic-substituted derivative thereof, where n is an integer from 1 to 20, preferably 2 to 4, linear, branched, or cyclic, and, x is an integer from 1 to 40, B is an alkylene oxide group of the formula:
$-[-(CH_2)_{n1}-O-]-$, or aromatic-substituted derivative thereof, where $n_1$ is an integer from 1 to 20, preferably 2 to 4, linear, branched, or cyclic, and y is an integer from 0 to 40, with the alkylene oxide group of B being different from that of A, and A plus B being formed from at least 2 alkylene oxide groups, preferably from 4 to 12 alkylene oxide groups, and E is a lactone group of the formula:

$$-\!\!\left[\!\!\begin{array}{c}O\\\|\\C\end{array}\!\!-(CH_2)_{n2}-O\right]\!\!-$$

where $n_2$ is an integer from 1 to 20, preferably 3 to 5, linear, branched, or cyclic, or a lactam group of the formula:

$$-\!\!\left[\!\!\begin{array}{c}O\\\|\\C\end{array}\!\!-(CH_2)_{n2}-\overset{R^2}{\underset{}{N}}\right]\!\!-$$

where $n_2$ is defined above and $R^2$ is defined below, although a lactone group is generally preferred, and z is an integer from 1 to 40, preferably 3 to 8, and m is an integer from 1 to 40, with m typically being 1, and P is selected from any polyfunctional alcohol group, thiol group, amine group or phosphate group, with a polyfunctional alcohol group being generally preferred; and, q is 0 or an integer from 1 to 10.

In the above, if q is 1 or more, P is even more preferably a polyfunctional alcohol group represented by the formula:

$$-[-O-G-]-$$

where G is of the formula:

$$-(A)_{s1}-(B)_{s2}-(E)_{s3}-(D)_{0\ or\ 1}-(W)_{0\ or\ 1}-(J)_{0\ or\ 1}-(B)_{s4}-(A)_{s5}-$$

where A, B, E and R are defined above,

D is an diester functional alkoxy radical of the formula:

$$-\!\!\left[\!\!\begin{array}{c}O\\\|\\C\end{array}\!\!-R-\begin{array}{c}O\\\|\\C\end{array}\!\!-O-A\right]_{\overline{t}}$$

where t is an integer from 1 to 40,

W is a radical of the formula $$-(R\overset{V_{0\ to\ 5}}{\diagup}\!-O)-$$

where V is an acidic group selected from $-COOH$, $-SO_3H$, and $PO_3HR^2$ where $R^2$ is a hydrogen atom or a $C_{1-18}$ alkyl radical, J is an ester functional alkyl radical of the formula:

$$-\!\!\left[\!\!CH_3-O-\overset{O}{\overset{\|}{C}}-R-O\right]_{\overline{t1}}$$

where $t_1$ is an integer from 1 to 6, and, with the proviso that if D+W+J=0, then $\Sigma s_1 \ldots s_5$ must be $\geq 1$.

The use of the above (meth)acrylate-functional urethane oligomer for all or part of the photopolymerizable component II) of the photoimageable composition, wherein the (meth)acrylate functionality in the oligomer is separated from the urethane linkage by a flexible block copolymer of at least two alkylene oxide groups and at least one ring-opened lactone group, solves the problems of the prior art and enables the photoimageable composition formed therefrom to possess excellent mechanical strength, flexibility, fine line adhesion, and resistance to developer scumming, combined with excellent chemical resistance to processing solutions and stripping ability.

The present invention also provides a photoimageable element comprising a support film and a layer of said photoimageable composition formed thereon.

DETAILED DESCRIPTION OF CERTAIN PREFERRED EMBODIMENTS

Herein, unless otherwise noted, all percentages are weight percentages. Component I) (the binder polymer) and Component II) (the photoimageable compounds(s)) and Component III) (the photoinitiator chemical system) are herein considered to equal 100 wt %, and other components are calculated as parts relative to 100 parts of I) plus II) plus III).

The term "(meth)acrylate" is meant to encompass "acrylate" and "methacrylate" functionality and mixtures thereof.

The invention is directed to photoimageable compositions which are developable in alkaline aqueous solution and which therefore have substantial acid functionality. Such photoimageable compositions typically have a binder polymer I) having acid functionality, typically an acid number of at least about 80, preferably at least about 100 and more preferably about 150 or more, up to about 250. The acid functionality is typically carboxylic acid functionality, but may also include, for example, sulfonic acid functionality or phosphoric acid functionality. Binder polymers for photoimageable compositions typically have weight average molecular weights between about 20,000 and about 200,000, preferably at least about 80,000.

The polymers are typically derived from a mixture of acid functional monomers and non-acid functional monomers. Some specific examples of suitable acid functional monomers are acrylic acid, methacrylic acid, maleic acid, fumaric acid, citraconic acid, 2-acrylamido-2-methylpropanesulfonic acid, 2-hydroxyethyl acrylolyl phosphate, 2-hydroxypropyl acrylol phosphate, 2-hydroxy-alpha-acryloyl phosphate, etc. One or more of such acid functional monomers may be used to form the binder polymer.

The acid functional monomers may be copolymerized with non-acid functional monomers, such as esters of acrylic acid and methacrylic acid, for example, methyl acrylate, 2-ethyl hexyl acrylate, n-butyl acrylate, n-hexyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate; styrene and substituted styrene, such as 2-methyl styrene and vinyl toluene and vinyl esters, such as vinyl acrylate and vinyl methacrylate to provide the desired acid number. The amount of the binder polymer I) may vary over a wide range, typically comprising between about 30 to about 80 wt % of the composition based on total weight of I) plus II) plus III).

Examples of such polymers and photoimageable compositions using such polymers are found, in the following U.S. Pat. Nos. 3,953,309, 4,003,877, 4,610,951, and 4,695,527 the teaching of each of which are incorporated herein by reference.

The photopolymerizable component II) described above having photopolymerizable poly $\alpha,\beta$-ethylenic unsaturation comprises between about 1 wt % and about 100 wt %, preferably at least about 20 wt % up to about 60 wt % of total amount of II), of the (meth)acrylate-functional urethane oligomer described above, i.e., between about 2 wt % and 70 wt %, preferably between about 5 wt % and 45 wt % based on total weight of I) plus II) plus III).

There are two currently preferred methods for forming the (meth)acrylate-functional urethane oligomers of this invention. The preferred method of forming the first group of urethane oligomers defined in the above formula by q=0 is to initially block copolymerize one or more lactone groups and two or more alkylene oxide groups onto a (meth)acrylic acid backbone by a conventional addition polymerization procedure, to produce the (meth)acrylate-functional group of formula T which has a hydroxy-terminus opposite the (meth)acrylate functionality.

While in the above described formula for T, (A), (B) if present, and (E) may theoretically be in any order, the preferred mode of oligomer synthesis generally dictates that (E) be at the terminus opposite the (meth)acrylate functionality. In the preferred synthetic route, (meth)acrylic acid is reacted with an alkylene oxide monomer or aromatic-substituted alkylene oxide monomer or a mixture of such monomers so as to produce (A). If desired, further reaction is carried out with an different alkylene oxide monomers, aromatic-substituted alkylene oxide monomers or mixture of such monomers to produce (B). The resulting product is then reacted with a lactone or lactam monomer or mixture of lactone or lactam monomers to produce (E).

Alkylene oxide monomers used in forming the (A) and (B) alkylene oxide groups generally contain 1 to 20 carbon atoms, although short chain alkylene oxides of at least 2 up to 4 carbon atoms, such as ethylene oxide, propylene oxide, butylene oxide and tetrahydrofuran, with ethylene oxide and propylene oxide being preferred. Also, aromatic-substituted alkylene oxide monomers, such as styrene oxide, may be used to form (A) and (B). While (B), if present, is herein defined as is (A), (B) is formed from a different monomer from (A). For example (A) could be formed from ethylene oxide and (B) could be formed from propylene oxide, or (A) could be formed from a mixture of ethylene oxide and tetrahydrofuran while (B) could be formed from a mixture of propylene oxide and styrene oxide. The optional incorporation of (B) allows the oligomer to be tailored to particular applications. To provide sufficient chain length to the oligomer, (A) plus (B) must be formed from at least 2 alkylene oxide monomers total, preferably between 4 and 12 monomers.

Lactone component (E) of the (meth)acrylate functional oligomeric group defined in above formula T is formed from 1 to 40 lactone monomer units, either a single lactone species or mixture of lactone species. The lactone species employed generally have from 1 to 20 carbon atoms (not including the carbonyl carbon), although 3 to 5 carbon atom species are generally preferred. Epsilon-caprolactone is especially preferred lactone for forming (C). Other suitable lactones include, but are not limited to, beta-butyrolactone, zeta-enantholactone, delta-valerolactone. Also, $C_1$–$C_6$ alkyl-substituted lactones, such as the alkyl delta-valerolactones, such as methyl-, ethyl-, hexyl-, dimethyl-, diethyl-, di-n-propyl-, di-n-hexyl-, di-iso-propyl-, trimethyl-, triethyl-, and tri-n-propyl-epsilon caprolactones, as well as $C_1$–$C_6$ alkoxy- and aromatic-substituted lactones may also be used. In addition to lactones, lactams may be substituted for forming component (E). Suitable lactams include those which correspond to the lactones listed above, with epsilon-caprolactam being especially preferred.

The oligomer thus formed is hydroxy-terminated at the terminus opposite the (meth)acrylate functionality.

Subsequently, the hydroxy-terminated (meth)acrylate oligomer is reacted with a polyfunctional isocyanate used in forming I in the above formula by a conventional urethane addition polymerization procedure, to produce the (meth)acrylate-functional urethane oligomer component II) of the present invention.

In the urethane reaction, the conditions are chosen so that the hydroxy terminal functionality of the (meth)acrylate functional oligomer reacts with all of the isocyanalte functionalities present in I, to end-cap each of the isocyanate groups with T. In the above formula, only 2 T's are shown as a matter of convenience. However, it should be understood that if I is tri-functional, rather than di-functional, 3 isocyanate end-capping T's will be present instead of 2 T's, and so on.

The polyfunctional isocyanates used in forming I can be a wide variety of organic isocyanates having a functionality of 2 or greater, or oligomers, biurets, or isocyanurates thereof. In the general formula above, simple examples of R groups include hexamethylene, phenylene, and cyclohexylene, although more complex divalent hydrocarbon moieties are also suitable. The choice of R is generally not considered to be particularly critical, the selection generally depending upon the commercial availability of suitable precursors. Examples of suitable polyisocyanates include 1,6-hexamethylene diisocyanate, 1,4-tetramethylene diisocyanate, 1,3- and 1,4-phenylene diisocyanate, 4,4'-methylenebis(phenylisocyanate), 2,4-toluene diisocyanate, 1,2,4-benzene triisocyanate, 1,4-cyclohexylene diisocyanate, isophorone diisocyanate, 4,4'-methylene bis (cyclohexyl isocyanate), polymethylene polyphenyl isocyanate, or biurets thereof, such as the biuret of hexamethylene diisocyanate, or isocyanurates thereof, such as the isocyanurate of hexamethylene diisocyanate, although hexamethylene diisocyanate, its biuret and its isocyanurate are especially preferred.

The preferred method for forming the second group of urethane oligomers where $q \geq 1$ is to initially react the polyfunctional isocyanate with a polyfunctional alcohol by a conventional addition polymerization procedure, to form a polyisocyanate/polyol adduct represented by the formula I—(P—I)$_q$. As can be from the formula, the reaction conditions are chosen so as to form an isocyanate-terminated urethane oligomer to the virtual exclusion of alcohol-terminated polymeric materials. The optional incorporation of the (P—I)$_q$ group into the urethane oligomer allows the oligomer to be tailored to particular applications. Subsequently, the isocyanate-terminated adduct is reacted with the hydroxy-terminated (meth)acrylate oligomer T defined above by a conventional urethane addition polymerization procedure, to produce the (meth)acrylate-functional urethane oligomer component II) of the present invention.

The polyfunctional alcohol may be selected from a variety of materials as indicated by the polyfunctional alcohol group defined as —[—O—G—]— in the above formula. Examples of suitable polyfunctional alcohols include: monomeric or polymeric diols, such as ethylene glycol, propylene glycol, 1,4-butanediol, 2-ethyl-1,6-hexanediol, 1,10-decanediol, 1,4-bis-hydroxymethylcyclohexane, diethylene glycol, triethylene glycol, polyethylene glycols having molecular weights (Mw) from about 200 to 1,500, the reaction products of 4,4'-dihydroxydiphenyl ether, 4,4'-dihydroxydiphenyl sulfide, 4,4'-dihydroxydiphenyl methane, 4,4'-dihydroxydiphenylpropane or 4,4'-dihydroxydiphenylsulfone with 0 to 40 moles of alkylene oxide, dihydroxycycloalkyls, bishydroxydicycloalkyls, polypropylene glycols, polytetrahydrofuran, polybutylene glycols, thioethylene glycol and dithiotriethylene glycol; polyester polyols, such as polycaprolactone, polybutyrolactone, polyethylene terephthalate, polypropylene adipate, polybutylene adipate, polyethylenebutylene sebacate, and other polyester polyols having molecular weights (Mw) in the range of about 500 to 3,000. Apart from the diols, monomer or polymeric compounds having 2 to 6 aliphatic hydroxy groups, such as glycerol, trimethylolpropane, pentaerythritol, dipentaerythritol, sorbitol, or polyalkoxylate derivatives of these; polymeric polyester polyols including the lactone polyesters; block copolymers of polyethers and polyesters having terminal hydroxy groups; and, caprolactone polyols and polysiloxane polyols, or the like. Other polyfunctional alcohols which contain acidic groups may also be used, including those described in U.S. Pat. No. 5,415,972. In addition to polyfunctional alcohols, polyfunctional amine, thiol or phosphate compounds may be substituted. For instance, examples of suitable polyfunctional amines include 1,6-hexanediamine, isophoronediamine, diaminodiphenylmethane, polyalkoxydiamines, etc. Examples of polyfunctional thiols include 1,2-ethanedithiol, 1,4-butanedithiol, 1,6-hexanedithiol, 1,9-nonanedithiol, etc. Examples of polyfunctional phosphates include any of a variety of available diphosphates.

Through use of the above-described (meth)acrylate-functional urethane oligomier whereby the chain which links the (meth)acrylate functionality to the urethane group is extended with at least two alkylene oxide groups and at least one ring-opened lactone or lactam group, improved flexibility and tenting strength of the cross-linked system is achieved. The flexibility is achieved by incorporation of a long chain attached to the crosslinkable ethylenically unsaturated (meth)acrylate functionality. Coupled with improved flexibility, the urethane oligomer improves the adhesive properties of the resist to the copper clad surface of blank circuit board following lamination. Better adhesion enables the production of a fine line (less than 75 microns) resist sidewall that adheres better to the copper surface of the circuit board.

Most surprising is the improvement seen in stripping and chemical resistance to processing solutions. Because the urethane oligomer produces better adhesion, stripping the resist from the copper surface would be expected to be more difficult. While not wishing to be bound by any particular theory, it is believed that by distancing the (meth)acrylate functionality from the urethane block with not only flexible alkylene oxide groups but also durable and high modulus lactone or lactam groups, the ester links present in the ring-opened lactone or lactam portion provide sites for hydroxide attack during the stripping operation, thereby greatly shortening stripping time. While producing sites for stripping solution attack, the relatively hydrophobic chain extension also provides good chemical resistance to alkaline developing solution, acid plating baths and acid etching solutions.

The balance of photopolymerizeable component II), if any, is typically a monomer, dimer or short chain oligomer having ethylenic unsaturation, particularly, α,β-ethylenic unsaturation, including monofunctional compounds and compounds having α,β-ethylenic unsaturation functionality 2 or greater. Typically, a mixture of mono-functional and multi-functional monomers will be used. Suitable photopolymerizeable compounds include, but are not limited to, the monomers recited above as suitable for forming binder polymers, particularly the non-acid functional compounds. Other particularly useful photopolymerizeable compounds are styrene maleic anhydride copolymers, or similar anhydride-containing copolymers, partially esterified with hydroxy-functional (meth)acrylic esters such as hydroxyethyl acrylate, polyethoxymono(meth)acrylate, and polyalkoxypolylactone mono(meth)acrylates such as those described herein and characterized by T. Polymers of the latter type are further described in and further set forth in U.S. Patent Application of Lundy, Barr and Reardon, entitled "Photoimageable Compositions Having Improved Chemical Resistance and Stripping Ability", filed the same day herewith, the teachings of which are incorporated herein by reference.

The total amount of photopolymerizeable component II) is typically between about 20 and about 70 wt % of the photoimageable composition based on total weight of I) plus II) plus III).

To initiate polymerization of the monomers upon exposure to actinic radiation, the photoimageable composition contains a photoinitiator chemical system. Generally, the photoinitiator chemical system comprises between about 0.1 and about 20 wt % based on total weight of I) plus II) plus III). Suitable photoinitiator chemicals include, but are not limited to, 9-phenylacridine, n-phenyl glycine, aromatic ketones (benzophenone, N, N'-tetramethyl-4, 4'-diaminobenzophenone [Michler's ketone], N,N'-tetraethyl-4,4'-diaminobenzophenone,4-methoxy-4'-dimethylaminobenzophenone, 3,3'-dimethyl-4-methoxybenzophenone, p,p'-bis(dimethylamino) benzophenone, p,p'-bis(diethylamino)-benzophenone, anthraquinone, 2-ethylanthraquinone, naphthaquinone, phenanthraquinone), benzoins (benzoin, benzoinmethylether, benzoinethylether, benzoinisopropylether, benzoin-n-butylether, benzoin-phenylether, methylbenzoin, ethybenzoin, etc.), benzyl derivatives (dibenzyl, benzyldiphenyldisulfide, benzyldimethylketal (SIC), etc.), acridine derivatives (9-phenylacridine, 1,7-bis(9-acridinyl)heptane, etc.), thioxanthones (2-chlorothioxanthone, 2-methylthioxanthone, 2,4-diethylthioxanthone, 2,4-dimethylthioxanthone, 2-isopropylthioxanthone, etc.), acetophenones (1,1-dichloroacetophenone, p-t-butyldichloroacetophenone, 2,2-diethoxyacetophenone, 2,2-dimethoxy-2-phenylacetophenone, 2,2-dichloro-4-phenoxyacetophenone, etc.), 2,4,5-triarylimidazole dimers (e.g., 2-(o-chlorophenyl)-4,5-diphenylimidazole dimer, 2-(o-chlorophenyl)-4,5-di(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer, etc.) etc. Though, not a free-radical generator, triphenylphosphine may be included in the photoinitiator chemical system as a catalyst.

The photoimageable composition may advantageously include one or moire plasticizers at between about 0.5 and about 10 wt % relative to the total weight of I) plus II) plus III). Examples of suitable plasticizers include, but are not limited to, phthalate esters (e.g., dibutylphthalate, diheptylphthalate, dioctylphthalate, diallylphthalate), glycols (e.g., polyethylene-glycol, polypropyleneglycol), glycol esters (e.g., triethylene-glycoldiacetate, tetraethyleneglycoldiacetate, dipropyleneglycol-dibenzoate), phosphate esters (tricresylphosphate, tripheynlphosphate), amides (p-toluenesulfoneamide, benzenesulfoneamide, -n-butylacetoneamide), aliphatic dibasic acid esters (diisobutyl-adipate, dioctyladipate, dimethylsebacate, dioctylazelate, dibutylmalate, triethylcitrate, tributylcitrate, triethylacetylcitrate, tri-n-propylacetylcitrate, tri-n-butylacetylcitrate, butyl-laurate, dioctyl-4,5-diepoxycyclohexane-1,2-dicarboxylate, glycerinetriacetylesters, dipropyleneglycol dibenzoate, polyethyleneglycol 200 dibenzoate, sucrose benzoate, trioctyl trimellitate, etc.

Compositions of the present invention typically include a color former to provide contrast to the light-exposed photoimageable composition. Color formers are typically used at between about 0.1 and about 1.0 wt % relative to total weight of I) plus II) plus III). Suitable color formers include, but are not limited to, diphenylamine, dibenzylaniline, triphenylamine, diethylaniline, diphenyl-p-phenylenediamine, p-toluidine, 4, 4'-biphenyldiamine, o-chloroaniline, etc., leuco crystal violet, leuco malachite green, etc.

Additionally, the photoimageable compositions may contain a wide variety of additional components as are known in the art, including additional polymers, such as those which might be used to effect a final hardened cure of a solder mask, dyes, color formers, stabilizers, flexibilizing agents, fillers, etc.

Processing of the photoimageable composition is in a conventional manner. In a typical procedure, a photoimageable composition layer, either formed from a liquid composition or as transferred as a layer from a dry film, is applied to a copper surface of a copper-clad board. When a dry film is used, the dry film typically comprises a liquid photoimageable composition dried onto a flexible polyester support sheet, e.g., polyethylene terephthalate, which is preferably transparent. A protective sheet, e.g., polyethylene, is usually provided on the surface of the dried photoimageable layer opposite the support sheet before the film is rolled into reels. The protective sheet is removed prior to application, e.g., lamination, to the copper-clad board. Once applied to the board (with the photoimageable composition facing the board), the photoimageable composition is then exposed to actinic radiation through appropriate artwork. Exposure to actinic radiation polymerizes the monomer in the light-exposed areas, resulting in a cross-linked structure that is resistant to developer. Next, the support film is removed from the top of the photoimageable composition and the exposed photoimageable layer is then is developed in dilute alkaline aqueous solution, such as a 1% sodium carbonate solution. The alkali solution causes salt formation with the carboxylic groups of the binder polymers, rendering them soluble and removable. After development, an etchant may be used to remove copper from those areas where the resist was removed, thereby forming a printed circuit. After development, an alternative process would be to build up the thickness of the exposed copper areas using an electrolytic plating procedure. After either etching or plating, the remaining resist is then removed using an appropriate stripper, such as 3% sodium hydroxide solution.

This invention is applicable to photoresists used in both etching and electrolytic plating processes. A particular advantage is enhanced resistance to process solutions coupled with rapid removal in stripping solutions which is truly a unique combination of properties not normally encountered with highly chemically resistant photoresists.

The invention will now be described in greater detail by way of specific examples.

EXAMPLE 1

Preparation of Urethane Oligomers Comprising Polyfunctional Isocyanates End-Capped with Poly (alkoxylated)/Poly(lactone) Block Copolymer Mono (meth)acrylates Urethane oligomers of the general structure T—I—(—P—I—)$_q$— T where q=0 of this example were prepared by the following procedure. A reaction vessel, fitted with a stirrer, thermocouple, and temperature bath, is charged with a poly(alkoxylated)/poly(lactone) mono(meth)acrylate alcohol (derived from polylactone additions to a polalkoxylated mono(meth)acrylate alcohol), antioxidants, and catalyst. Thereafter, the polyisocyanate is slowly added to the agitated alcohol mixture under a dry air blanket at an NCO/OH ratio of about 0.9/1.0. The temperature is controlled throughout the addition process and usually is held at 30°–35° C. After all of the isocyanate has been added, the mixture is held at 35°±5° C. for 1–4 hours, then cooled to ambient conditions and packaged.

The antioxidants used in these synthesis are of the phenol types and are either hydroquinone monomethyl ether and/or octadecyl 3,5-bis(1,1-dimethylethyl)-4-hydroxybenzene-propanoate, but selection does not have to be limited to these two materials.

The catalysts used in these synthesis can be of any of the usual organometallics commonly utilized in urethane reactions, but in all of the examples cited has been dibutyltin dilaurate.

Examples of urethane oligomers prepared by this method include:
Compound 1

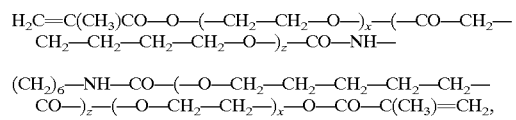

where in T: for (A), x=5–6, for (B), y=0, and for (E), z=3,4, or 6.
Compoung 2

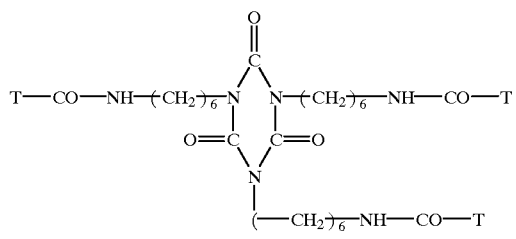

where T is:

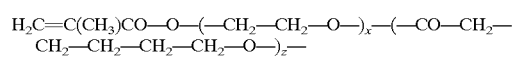

and for (A), x=5–6, for (B), y=0, and for (E), z=3, 4, or 6.

EXAMPLE 2

Preparation of Urethane Oligomers Comprising Polyfunctional Isocyanate Prepolymers End-Capped with Poly(alkoxylated)/Poly(lactone) Block Copolymer Mono(meth)acrylates Urethane oligomers of the general structure T—I—(—P—I—)$_q$—T where q≧1 of this example were prepared by the following procedure. First, a reaction vessel, fitted with a stirrer, thermocouple, and temperature bath is charged with a polyisocyanate and catalyst. Thereafter, a polyfunctional alcohol (hereafter referred to as a polyol) is slowly added under dry nitrogen to the agitated isocyanate mixture (preheated to about 40° C.) at a NCO/OH ratio of about 2.04/1.0, to produce an isocyanate-terminated polyol adduct. The mixture temperature is allowed to elevate (from the exotherm) to approximately 60° C., and then controlled to keep the exothermic rise from exceeding 60° C. until all of the polyol has been added and the exotherm has peaked. The temperature is then maintained at anywhere from 60° C. to 80° C., depending on the selection of polyol and polyisocyanate, for 1 to 2 hours, and then is cooled to below 40° C.

In a second reaction vessel, also fitted with a stirrer, thermocouple, and temperature bath, is charged a poly(alkoxylated)/poly(lactone) mono(meth)acrylate alcohol (meth)acrylate monoalcohol and antioxidant. Under a dry air blanket, the polyisocyanate reaction product from the first vessel is slowly added to the agitated (meth)acrylate alcohol mixture, at an NCO/OH ratio of 1.0/1.0, keeping the temperature at 30°–35° C. After all of the polyisocyanate reaction product had been added, the temperature is held at 35°±5° C. for 1 to 4 hours, then is cooled to ambient and packaged.

Examples of the urethane oligomers which have been prepared by this method include:
In all cases

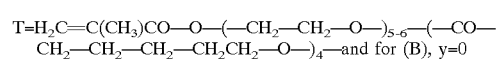

and,

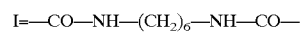

Compound 3
P follows the structure —[—O—G—]— where G=—(A)$_5$—(W) —(A)$_5$— and W=bisphenol A, or in other words,

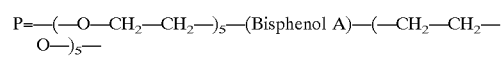

and,
q=1
Compound 4
P follows the structure —[—O—G—]— where G=—(A)$_3$—(W)—(A)$_3$— and W=bisphenol A, or in other words,

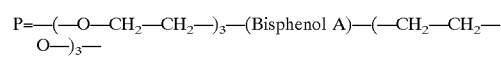

and,
q=1
Compound 5
P follows the structure —[—O—G—]— where G=—(A)$_7$—, or in other words,

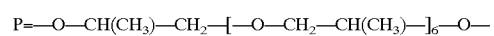

and,
q=1
Compound 6
P follows the structure —[—O—G—]— where G=—(A)$_{13}$—, or in other words,

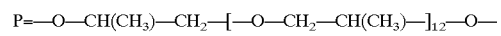

and,
q=1

Compound 7

P follows the structure —[—O—G—]— where G=—(A)$_{17}$—, or in other words,

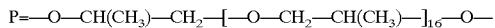
P=—O—CH(CH$_3$)—CH$_2$—[—O—CH$_2$—CH(CH$_3$)—]$_{16}$—O— and, q=1

Compound 8

Follows the structure T—I—(—P—I—)$_3$—T or T—I—P—I—P'—I—P—I—T

P follows the structure —[—O—G—]— where G=—(A)$_5$—(W)—(A)$_5$— and W=bisphenol A, or in other words,

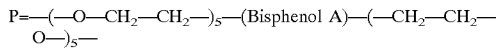
P=—(—O—CH$_2$—CH$_2$—)$_5$—(Bisphenol A)—(—CH$_2$—CH$_2$—O—)$_5$— and, q=1

P' follows the structure —[—O—G—]— where G=W=

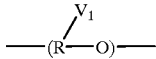
—(R—O)— where V=COOH, or in other words

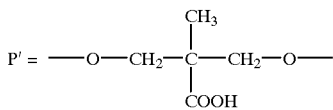
P' = —O—CH$_2$—C(CH$_3$)(COOH)—CH$_2$—O—

Compound 9

Is like Compound 8 except that

P follows the structure —[—O—G—]— where G=—(A)$_7$—, or in other words,

P=—O—CH(CH$_3$)—CH$_2$—[—O—CH$_2$—CH(CH$_3$)—]$_6$—O—and, q=1

Compound 10

Is like Compound 3 except that

P follows the structure —[—O—G—]— where G=J and for J, R=C$_{18}$H$_{34}$ and t$_1$=~3, or in other words, P is Castor Oil Compound 11

Is like Compound 10 except that

P follows the structure —[—O—G—]— where G=J—A$_5$, and for J, R=C$_{18}$H$_{34}$ and t$_1$=~3, or in other words, P is ethoxylated Castor Oil (15 moles EO)

EXAMPLE 3

Comparison of Negative-Acting Photoresists

The following ingredients were blended together in the given proportions to provide a negative-acting photoresist composition of the present invention (Formulation 2) along with a comparative photoresist composition (Formulation 1).

| Ingredients | Wt % 1 | Wt % 2 |
|---|---|---|
| Acrylic Binder Polymer[1] | 39 | 39 |
| Acrylic Binder Polymer[2] | 12 | 12 |
| Urethane Oligomer A[3] | 15 | |
| Urethane Oligomer B[4] | | 15 |
| Polyethoxylated BisphenolA Dimethacrylate | 14 | 14 |
| Polpropylene Glycol Monomethacrylate | 11 | 11 |
| Aromatoc Sulfonamide | 4.5 | 4.5 |
| Aromatic Acridine Photoinitiator | 0.1 | 0.1 |
| Leuco Dye | 0.35 | 0.35 |
| Bis Dialkylaminoketone | 0.05 | 0.05 |
| Halogenated Iophine Dimer | 3.5 | 3.5 |
| Poylacrylate Rheology Modifier | 0.1 | 0.1 |
| Aromatic Polyacid | 0.05 | 0.05 |
| Polyaromatic Phosphine | 0.3 | 0.3 |
| Triphenylmethane Dye | 0.05 | 0.05 |

Table Footnotes
[1] 90,000 Mw copolymer of MMA, MAA, n-BA, Tg 90° C., 150 acid number.
[2] 25,000 Mw copolymer of styrene, AA, Tg 102° C., 239 acid number.
[3] Comparative Urethane Oligomer of the Structure:

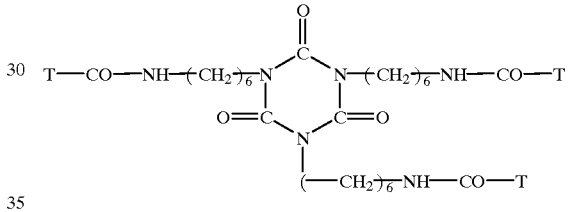

where for T
R$^1$ = —CH$_3$, and for A, n = 2 and x = 6, while for B, y = 0 and for E, z = 0 and q = 0
[4] Urethane Oligomer of the Present Invention of the Structure:

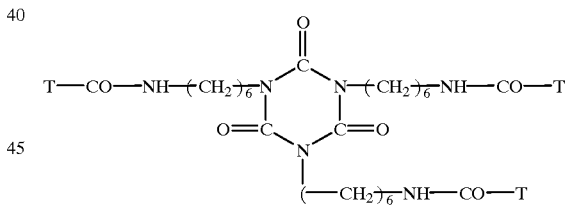

where for T
R$^1$ = —CH$_3$, and for A, n = 2 and x = 6, while for B, y = 0 and for E, n = 5 (linear) and z = 4 and q = 0.

Each mixture was prepared at about 55% solids in 2-butanone and coated onto a 0.8 mil polyester carrier film and dried to approximately 1% residual VOC's. A thin film of about 1.5 mils thickness was obtained. The films were then laminated at 121° C., 40 psi, 1 meter per minute, onto chemically cleaned 1 oz. copper/0.059 FR-4/1 oz. clad copper laminates and imaged on a 5 kw printer through a silver halide phototool with an adjusted exposure to obtain a copper step of 7 and 9 as measured with a Stouffer®21 step wedge. The imaged panels were then developed in 1% sodium carbonate monohydrate at 49° C. to remove the photoresist in the unexposed portions, followed by several spray rinses using tap water and the deionized water. Using an etching process to gather some of the data, the developed panels were then etched in 2N cupric chloride/HCl solution at 45° C. The panels were then stripped of the imaged and developed photoresist in a 3% sodium hydroxide solution at 49° C., followed by a spray rinse of tap water. Using an electrolytic plating process for the remainder of the data, another set of developed and rinsed panels having a suitable plating pattern imaged thereon were dipped in a liquid aid preplate cleaner (LAC 81 marketed by Morton Electronic Materials) for about 3 minutes, then rinsed with tap water for 1 minute, followed by etching for 30 seconds in a 10% strength ammonium peroxysulfate solution. The panels were then rinsed again with tap water, immersed for 1 minute in 10% strength fluoroboric acid, and then electroplated for 30 minutes in fluoboric tin/lead plating solution (current density 15 amps/ft$^2$, metal deposit approximately 30μm at room temperature), followed by a 5 minute rinse with tap water.

Performance test results are given in the Table below.

| Performance Tests | Formulations 1 | Formulations 2 |
|---|---|---|
| Thickness (μm) | 37 μm | 36 μm |
| Break Point[1] (1% Na$_2$CO$_3$.H$_2$O, 29.4° C.) | 14.5 sec | 18.4 sec |
| Sensitivity (mJ) solid step 7 | 23 | 76 |
| Sensitivity (mJ) solid step 9 | 45 | 149 |
| Stripping Time[2], step 7 (3% NaOH, 54° C.) | 39 sec | 34 sec |
| Stripping Mode[3], step 7 (3% NaOH, 54° C.) | sm-lg | Xlg |
| Stripping Time, step 9 (3% NaOH, 54° C.) | 40 sec | 34 sec |
| Stripping Mode, step 9 (3% NaOH, 54° C.) | vsm-md | mdlg-Xlg |
| Fine Line Adh (step 7, 2 × B.P.) | 30 μm | 30 μm |
| Resolution (step 7, 2 × B.P.) | 50 μm | 55 μm |
| Solid SST41 (step 7, 2 × B.P.) | 22 | 21.7 |
| Fine Line Adh (step 7, 4 × B.P.) | 45 μm | 35 μm |
| Resolution[4] (step 7, 4 × B.P.) | 45 μm | 40 μm |
| Solid SST41 (step 7, 4 × B.P.) | 20.8 | 19.7 |
| Fine Line Adh (step 9, 2 × B.P.) | 25 μm | 25 μm |
| Resolution (step 9, 2 × B.P.) | 70 μm | 80 μm |
| Solid SST41 (step 9, 2 × B.P.) | 28.0 | 28.1 |
| Tent Strength[5], wet (20° C., step 7, 6.0 mm) | 584 gms | 947 gms |
| Tent Strength, wet (20° C., step 9, 6.0 mm) | 643 gms | 1088 gms |
| Fine Line Adh, μm (step 7 after etch) | 70 | 40 |
| Fine Line Adh, μm (step 9 after etch) | 50 | 37 |
| Cross Hatch Adh % intact (after dev., step 7) | 98 | 100 |
| Cross Hatch Adh % intact (after dev., step 9) | 75 | 90 |
| Underplating (after plating 38 μm Sn/Pb) | slight | very slight |
| Tape Adhesion (after Sn/Pb plating) | poor | very good |
| Stripping Time at step 7 (after Sn/Pb plating) | 101 sec | 80 sec |
| Stripping Time at step 9 (after Sn/Pb plating) | >180 sec | 92 sec |

Table Footnotes
[1]The breakpoint time was recorded at the point the resist dissolved completely in 1% Na$_2$CO$_3$.H$_2$O at 29.4° C.
[2]The stripping time was recorded at the point the resist stripped completely in 3% NaOH at 54° C.
[3]The particle size of the stripped resist pieces coming off the board was visually recorded.
[4]The resolution is measured as the minimum value of fully developed equal lines and spaces.
[5]Puncture strength with 2 mm radius tipped probe through a tented 6 mm hole after 4 minute immersion in 20° C. tap water.

From the foregoing it will be seen that this invention is one well adapted to attain all ends and objects hereinabove set forth together with the other advantages which are apparent and inherent. Since many possible variations may be made of the invention without departing from the scope thereof, the invention is not intended to be limited to the embodiments and examples disclosed, which are considered to be purely exemplary. Accordingly, reference should be made to the appended claims to assess the true spirit arid scope of the invention, in which exclusive rights are claimed.

What is claimed:

1. A negative-acting photoimageable composition comprising:

I) a binder polymer having sufficient acid functionality to render said photoimageable composition developable in alkaline aqueous solution;

II) an addition-polymerizable non-gaseous α,β-ethylenically unsaturated compound(s) capable of forming a high polymer by free-radical initiated chain-propagating addition polymerization; and III) a radiation-sensitive free-radical generating photoinitiator chemical system activatable by actinic radiation to initiate chain-propagating addition polymerization of the addition-polymerizable material, wherein all or a portion of said component II) comprises a (meth)acrylate functional urethane oligomer having the formula:

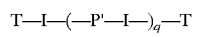

where I at each independent occurrence is a radical of the formula:

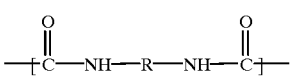

where R is a polyvalent aliphatic, cycloaliphatic, or aromatic hydrocarbon group; T at each independent occurrence is selected from a (meth)acrylate-functional radical of the formula:

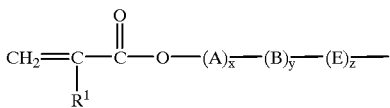

where $R^1$ is a hydrogen atom or a methyl group, A, B and E are in the order given or in any order, A is an alkylene oxide group of the formula: —[—$(CH_2)_n$—O—]— where n is an integer from 1 to 20 and x is an integer from 1 to 40, B is an alkylene oxide group of the formula: —[—$(CH_2)_{n1}$—O—]— where n1 is an integer from 1 to 20 and y is an integer from 0 to 40 with the alkylene oxide group of B being different from that of A, and A plus B being formed from at least 2 alkylene oxide groups, and E is a ring-opened lactam group of the formula:

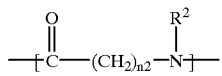

where n2 is an integer from 1 to 20 and $R^2$ is a hydrogen atom or a $C_{1-18}$ alkyl radical, or E is a mixture of the ring-opened lactam group and a ring-opened lactone group of formula:

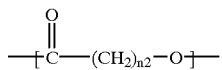

where n2 is as defined above and z is an integer from 1 to 40; P is of the formula: —[O—G—]— where G is of the formula: —$(A)_{s1}$—$(B)_{s2}$—$(E)_{s3}$—$(D)_f$—$(W)_k$—$(J)_u$—$(B)_{s4}$—$(A)_{s5}$— where A, B, E and R are defined above, f is 0 or 1, k is 0 or 1 and u is 0 or 1, D is a diester functional alkoxy radical of the formula:

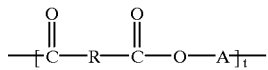

where t is an integer from 1 to 40, W is a radical of the formula:

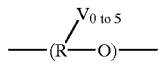

where V is an acidic group selected from —COOH, —$SO_3H$, and $PO_3HR^2$ where $R^2$ is a hydrogen atom or a $C_{1-18}$ alkyl radical, J is an ester functional alkyl radical of the formula:

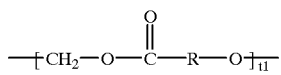

where t1 is an integer from 1 to 6, and, with the proviso that if f+k+u=0, then $\Sigma s_1 \ldots s_5$ must be $\geq 1$.

2. The photoimageable composition of claim 1, wherein said (meth)acrylate functional urethane oligomer comprises between about 5 wt % and about 45 wt % based on total weight of I) plus II) plus III).

3. The photoimageable composition of claim 1, comprising:
   I) between about 30 and about 70 wt % based on total weight of I) plus II) plus III) of said binder polymer;
   II) Between about 20 and about 70 wt % based on total weight of I) plus II) plus III) of said addition-polymerizable, non-gaseous α, β-ethylenically unsaturated compound(s); and
   III) Between about 0.1 and about 20 wt % based on the total weight of I) plus II) plus III) of said photoinitiator chemical system.

4. The photoimageable composition of claim 3, wherein said (meth)acrylate functional urethane oligomer comprises between about 1 and 100 wt % of II).

5. A dry film photoresist useful in the manufacture of printed circuit boards, comprising: a polymeric support sheet and a layer of the photoimageable composition of claim 1 thereon.

6. The photoimageable composition of claim 1, wherein q=0.

7. The photoimageable composition of claim 1, wherein q=1 to 10.

8. A negative-acting photoimageable composition comprising:
   I) a binder polymer having sufficient acid functionality to render said photoimageable composition developable in alkaline aqueous solution;
   II) an addition-polymerizable non-gaseous α,β-ethylenically unsaturated compound(s) capable of forming a high polymer by free-radical initiated chain-propagating addition polymerization; and
   III) a radiation-sensitive free-radical generating photoinitiator chemical system activatable by actinic radiation to initiate chain-propagating addition polymerization of the addition-polymerization material, wherein all or a portion of said component II) comprises a (meth)acrylate functional urethane oligomer having the formula:

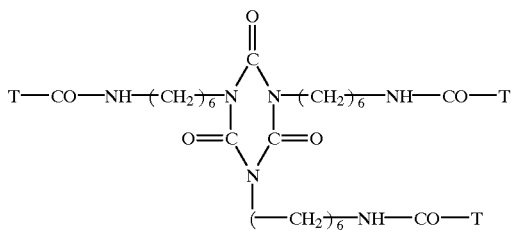

T is:

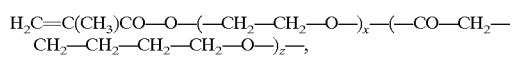

Wherein x=5 or 6 and z=3, 4, or 6.

* * * * *